United States Patent [19]
Critchlow et al.

[11] Patent Number: 5,644,602
[45] Date of Patent: Jul. 1, 1997

[54] DIRECT DIGITAL FREQUENCY SYNTHESIZER FOR USE IN A SUBSCRIBER UNIT OF A WIRELESS DIGITAL COMMUNICATION SYSTEM

[75] Inventors: David Norton Critchlow, San Diego; Karle Joseph Johnson, Carlsbad, both of Calif.

[73] Assignee: InterDigital Technology Corporation, Wilmington, Del.

[21] Appl. No.: 445,082

[22] Filed: May 22, 1995

Related U.S. Application Data

[62] Division of Ser. No. 222,670, Apr. 4, 1994, which is a continuation of Ser. No. 940,662, Sep. 4, 1992, Pat. No. 5,325,396, which is a continuation of Ser. No. 658,065, Feb. 20, 1991, Pat. No. 5,146,473, which is a continuation of Ser. No. 394,497, Aug. 14, 1989, Pat. No. 5,008,900.

[51] Int. Cl.⁶ .............................. G06F 1/035; H04L 27/20
[52] U.S. Cl. ......................... 375/308; 364/712; 327/106
[58] Field of Search ................................ 375/272, 279, 375/303, 308, 329, 334; 364/721; 327/105, 106

[56] References Cited

U.S. PATENT DOCUMENTS

| | | | |
|---|---|---|---|
| 4,123,774 | 10/1978 | Hjortzberg | 358/320 |
| 4,404,532 | 9/1983 | Welti | 375/308 X |
| 4,644,561 | 2/1987 | Paneth | 375/223 |
| 4,672,634 | 6/1987 | Chung et al. | 375/303 |
| 4,675,882 | 6/1987 | Lillie et al. | 375/324 |
| 4,689,804 | 8/1987 | Srinivasagopalan et al. | 375/346 |
| 4,754,340 | 6/1988 | Nakagawa et al. | 358/326 |
| 4,764,940 | 8/1988 | Paneth et al. | 375/308 |
| 4,777,633 | 10/1988 | Fletcher et al. | 379/59 X |
| 4,811,420 | 3/1989 | Avis et al. | 455/51.1 |
| 4,825,448 | 4/1989 | Critchlow et al. | 375/222 |
| 4,873,500 | 10/1989 | Genrich | 375/308 |
| 4,881,240 | 11/1989 | Critchlow et al. | 375/235 |
| 4,893,316 | 1/1990 | Janc et al. | 375/271 |
| 4,893,317 | 1/1990 | Critchlow et al. | 375/344 |
| 4,905,177 | 2/1990 | Weaver, Jr. et al. | 364/721 |
| 4,926,130 | 5/1990 | Weaver | 327/105 |
| 4,962,510 | 10/1990 | McDavid et al. | 375/308 |
| 4,965,533 | 10/1990 | Gilmore | 331/18 |
| 4,985,684 | 1/1991 | Jentz et al. | 329/327 |

(List continued on next page.)

FOREIGN PATENT DOCUMENTS

| | | | |
|---|---|---|---|
| 0194791 | 3/1986 | European Pat. Off. | H04L 27/00 |
| 0204570 | 6/1986 | European Pat. Off. | H03D 7/16 |
| 0469303 | 6/1991 | European Pat. Off. | G06F 1/03 |
| 2602929 | 7/1987 | France | H03D 7/00 |
| 8701531 | 8/1985 | WIPO | H03D 1/24 |

OTHER PUBLICATIONS

Twenty Second Asilomar Conference on Signals, Systems and Computers; vol. 1, pp. 199–203; J. Gray et al.
International Conference on Mobile Radio Systems Techniques; pp. 6–10 J. Masterton et al.
IEEE Proceedings, Physical Science Measurement and Instrumentation Management and Education; Part 132, pp. 425–432, P.D. White.
IEEE International Symposium on Circuits and Systems; 1988, vol. 2, pp. 1803–1810, E. Kuisma et al.

*Primary Examiner*—Young T. Tse
*Attorney, Agent, or Firm*—Volpe and Koenig, P.C.

[57] ABSTRACT

A digital frequency synthesizer for use in a subscriber unit of a wireless digital communication system includes a processor, for providing an output phase signal corresponding to a selected output digital frequency a storage device having predefined stored values pertaining to the amplitude of a signal for a single quadrant, and a signal generator which receives the phase signal and generates sine and cosine waveforms utilizing amplitude values obtained from the lookup tables. The signal generator accesses the storage device differently depending upon the quadrant and sign of the phase data such that the storage device provides an amplitude value from said set of values based upon the phase data.

3 Claims, 5 Drawing Sheets

U.S. PATENT DOCUMENTS

| | | | |
|---|---|---|---|
| 4,998,072 | 3/1991 | Sheffer | 364/718 |
| 5,008,900 | 4/1991 | Critchlow et al. | 375/222 |
| 5,028,887 | 7/1991 | Gilmore | 331/18 |
| 5,045,817 | 9/1991 | Shetter | 332/117 |
| 5,073,869 | 12/1991 | Bjerede | 364/718 |
| 5,115,452 | 5/1992 | Cupo | 375/232 |
| 5,121,412 | 6/1992 | Borth | 332/104 X |

DIRECT DIGITAL FREQUENCY SYNTHESIZER FOR USE IN A SUBSCRIBER UNIT OF A WIRELESS DIGITAL COMMUNICATION SYSTEM

This is a divisional of application Ser. No. 08/222,670, filed on Apr. 4, 1994, which is a continuation of 07/940,662, filed on Sep. 4, 1992, now U.S. Pat. No. 5,325,396 which is a continuation of 07/658,065, filed on Feb. 20, 1991, now U.S. Pat. No. 5,146,473, which is a continuation of 07/394,497, filed on Aug. 14, 1989, now U.S. Pat. No. 5,008,900.

BACKGROUND AND SUMMARY OF THE INVENTION

The present invention generally pertains to subscriber communications systems and is particularly directed to an improved subscriber unit for wireless communication with a base station in a wireless digital subscriber communication system.

A typical subscriber unit is described in U.S. patent application No. 06/893,916 filed Aug. 7, 1986 by David N. Critchlow et al. A base station used with such a subscriber unit in a wireless digital subscriber communication system is described in U.S. Pat. No. 4,777,633 to Thomas E. Fletcher, Wendeline R. Avis, Gregory T. Saffee and Karle J. Johnson. The subscriber unit described in U.S. Pat. No. 4,825,448 includes means for transcoding a digital voice input signal to provide digital input symbols; means for FIR filtering the digital input symbols; means for deriving an analog intermediate frequency input signal from the filtered input symbols; means for combining the intermediate frequency input signal with an RF carrier for radio transmission to the base station; means for demodulating an output signal received from the base station to provide digital output symbols; and means for synthesizing a digital voice output signal from the digital output symbols. The subscriber unit includes a baseband processor chip and a modem processor chip. Both are TMS32020 digital signal processors. The baseband processor chips perform the transcoding of the digital voice input signal, the synthesis of the digital output symbols, and various baseband control functions; and the modem processor chip performs the FIR filtering of the digital input symbols, and the demodulation of the output signal received from the base station. The modem processor chip generally acts as the master for the system.

SUMMARY OF THE INVENTION

The present invention provides a less expensive subscriber unit. The subscriber unit of the present invention includes means for transcoding a digital voice input signal to provide digital input symbols; means for FIR filtering the digital input symbols; means for modulating a digital intermediate frequency signal with the filtered input symbols to provide a modulated intermediate frequency input signal; means for processing the modulated input signal for transmission to the base station; means for demodulating an output signal received from the base station to provide digital output symbols; and means for synthesizing a digital voice output signal from the digital output symbols; wherein the subscriber unit includes a FIR chip for performing said FIR filtering of the digital input symbols; a DIF chip for digitally synthesizing said digital intermediate frequency signal and for performing said modulation of said digital intermediate frequency signal; and a single processor chip for performing said transcoding of said digital voice input signal, for performing said demodulation of said output signal received from the base station, and for performing said synthesizing of the digital output symbols.

The FIR chip performs the FIR filtering function that was implemented by software in the modem processor of the prior art subscriber unit described above. By moving the time consuming transmit FIR filtering function out of the modem processor and by performing the demodulation function with the same processor that performs the baseband processing function, only one processor chip is required.

The means for digitally synthesizing the digital intermediate frequency signal is a direct digital synthesizer (DDS) which include means coupled to the processor chip for accumulating phase data provided by the processor chip to indicate a predetermined intermediate frequency; and means for processing the accumulated phase data to generate said digital intermediate frequency signal at the predetermined intermediate frequency. The present invention thus adds new functionality to the subscriber unit which did not exist in the prior art subscriber unit described above in that direct digital synthesis enables extremely flexible tuning of the subscriber unit. In the prior art subscriber unit described above, tuning was restricted to a finite set of channels spaced at 25 KHz increments. Also the frequency difference between transmit and receive was fixed at 5 MHz. The DDS function of the DIF chip removes these limitations, thereby allowing other types of channel spacings or TX/RX offsets to be supported with minimal or no modification to the subscriber unit hardware.

Accordingly the DIF chip provides a fully modulated digital IF signal that can be digitally synthesized at any one of a plurality of different predetermined IF frequencies; and fine resolution frequency adjustment can be provided in the DIF chip to allow frequency tracking of the output signal received from the base station. These two features allow the radio of the subscriber unit to contain only a fixed frequency LO reference and eliminates the requirement of an RF synthesizer. These two features also allow the primary frequency reference in the subscriber unit to be fixed, with all tuning adjustments being performed by the DIF chip.

A direct digital synthesizer is stable and easy to produce. Phase noise specifications can be met without the need for an expensive and complex PLL RF synthesizer. The DDS feature provides frequency agility within the IF band and provides easier frequency modifications for operation in other bands.

Another feature of the present invention is that the FIR chip includes means for generating timing signals for timing the transcoding operation and the operation of synthesizing the digital voice output signal by the processor chip.

However, the processor chip performs the demodulation of the output signal received from the base station independently of the timing signals generated by the FIR chip. The processor chip receives said output signal in accordance with the timing signals generated by the FIR chip, and buffers the received output signal for demodulation, thereby allowing the processor chip to perform said demodulation when not performing said transcoding and synthesizing operations.

The present invention also reduces manufacturing costs by including a combination of a slow memory coupled to the processor chip for storing processing codes used by the processor chip when said codes need not be operated with zero wait states; and a fast memory coupled to the processor chip for temporarily storing processing codes used by the processor chip when said codes are operated with zero wait states. Fast RAMs (with a zero wait state) and fast EPROMs with the same chip density are very expensive. In order to reduce costs, the processor codes can be stored in a slow EPROM (with one or more wait states), and when procedures must be run with zero wait states, the code can be uploaded from the slow memory to the fast memory and run from there.

Additional features of the present invention are described in relation to the description of the preferred embodiment.

DEFINITION OF ABBREVIATIONS AND ACRONYMS

The following is a definition of abbreviations and acronyms used herein:

| | |
|---|---|
| A/D | Analog to Digital |
| AGC | Automatic Gain Control |
| ASIC | Application Specific Integrated Circuit |
| BPSK | Binary Phase Shift Keying |
| CCT | Channel Control Task |
| CCU | Channel Control Unit |
| CRC | Cyclic Redundancy Check |
| DAC | Digital to Analog Converter |
| DDS | Direct Digital Synthesizer |
| DIF | Digital Intermediate Frequency |
| DIP | Dual In-line Package |
| DOR | Data Output Ready |
| DPSK | Differential Phase Shift Keying |
| DSP | Digital Signal Processing |
| EPROM | Erasable Read Only Memory |
| FIR | Finite Impulse Response |
| I/O | Input/Output |
| LSB | Least Significant Bit |
| MPT | Modem Processing Task |
| MSB | Most Significant Bit |
| MUX | Multiplexer |
| PCM | Pulse Code Modulation |
| PLL | Phase Locked Loop |
| PWM | Pulse Width Modulation |
| QPSK | Quadrature Phase Shift Keying |
| RAM | Random Access Memory |
| RCC | Radio Control Channel |
| RELP | Residual Excited Linear Predictive |
| RF | Radio Frequency |
| ROM | Read Only Memory |
| RX | Receive |
| RXCLK | Receive Clock |
| RXSOS | Receive Start of Slot |
| SCT | Subscriber Control Task |
| SLIC | Subscriber Line Interface Circuit |
| SPC | Signal Processing Control |
| SPT | Signal Processing Task |
| SPTCTL | Signal Processing Task Controller |
| SSB | Switch-hook Sample Buffer |
| TDM | Time Division Multiplexing |
| TX | Transmit |
| TXCLK | Transmit Clock |

-continued

| | |
|---|---|
| UART | Universal Asynchronous Receiver Transmitter |
| VLSI | Very Large Scale Integration |
| XOR | Exclusive Or |

DESCRIPTION OF THE PREFERRED EMBODIMENT

Figure 1:
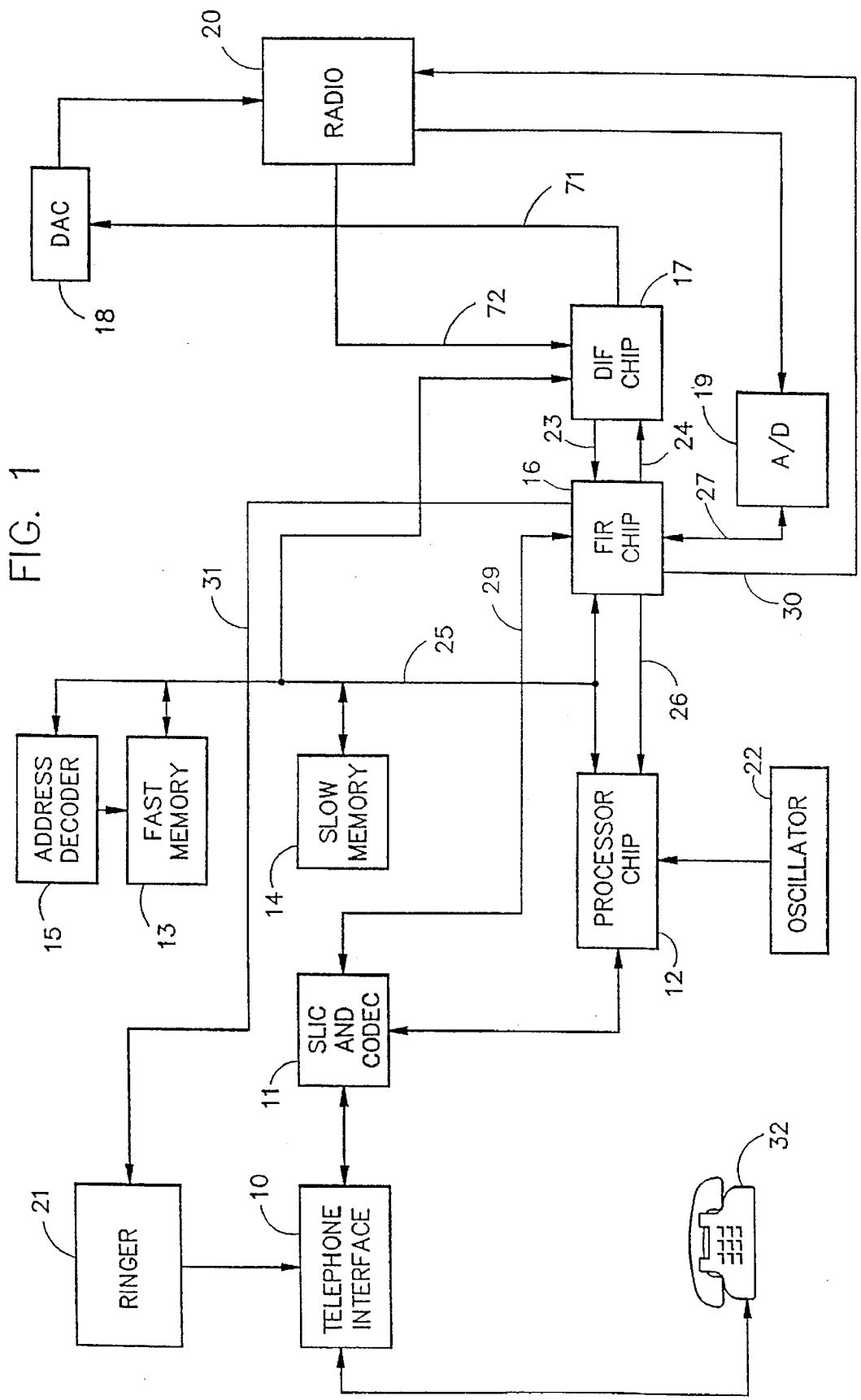
FIG. 1 is a block diagram of a preferred embodiment of the subscriber unit of the present invention.

Referring to FIG. 1, a preferred embodiment of the subscriber unit of the present invention includes a telephone interface circuit 10, a SLIC and codec circuit 11, a processor chip 12, a fast memory 13, a slow memory 14, an address decoder 15, a FIR chip 16:.a DIF chip 17, a DAC 18, an A/D converter 19, a radio 20, a ringer circuit 21, and an oscillator 22.

The FIR chip 16, which is an ASIC chip, is interfaced with the DIF chip 17 by lines 23 and 24, to the processor chip 12 by processor bus 25 and line 26, to the A/D converter 19 by line 27, to the SLIC and codec circuit 11 by line 29, to the radio 20 by line 30, and to the ringer circuit 21 by line 31.

The telephone interface circuit 10 is interfaced with a telephone 32, which converts sound waves into an input voice signal, and converts an output voice signal into sound waves, The SLIC and codec circuit 11 is coupled to the telephone interface circuit 10 for converting the input voice signal into a baseband digital input signal, which is provided to the processor chip 12.

In an alternative embodiment (not shown), the processor chip is also interfaced directly with an UART for alternatively receiving digital input signals directly from and sending digital output signals directly to a digital signal I/O device.

The processor chip 12 includes a model TMS320C25 digital signal processor, which transcodes the baseband digital input signal in accordance with a RELP algorithm to provide TX data digital input symbols on the processor bus 25. The use of a digital signal processor to perform a RELP algorithm is described in International Patent Application No. PCT/US85/02168, international Publication No. WO 86/02726, published 9 May 1986.

The FIR chip 16 FIR filters the digital input symbols and provides I,Q data to the DIF chip 17 on lines 24.

The DIF chip 17 interpolates the filtered digital input symbols, and modulates a digital intermediate frequency signal with the interpolated input symbols to provide a modulated digital input signal.

The DAC 18 converts the modulated digital input signal into a modulated analog input signal.

The radio 20 transmits the modulated analog input signal to the base station; and receives and demodulates a modulated analog output signal from the base station.

The oscillator 22 is a free running oscillator, that provides clock signals for the processor chip 12.

A description of the relationship between the subscriber unit and the base station is contained in U.S. Pat. No. 4,777,633.

The A/D converter 19 converts the demodulated received analog output signal into a digital output signal containing digital output symbols.

The processor chip 12 synthesizes a baseband digital output signal from the digital output symbols. Synthesis of RELP transcoded symbols by a digital signal processor also is described in International Publication No. WO 86/02726.

The processor chip 12 further performs echo cancellation as described in U.S. Pat. No. 4,697,261 to David T. K. Wang and Philip J. Wilson.

The SLIC and codec circuit 11 converts the baseband digital output signal into the output voice signal that is provided by the telephone interface circuit to the telephone 32.

The FIR chip 16 consolidates circuit functionality into a VLSI device in order to reduce production cost of the subscriber unit by eliminating many separate medium scale integration parts.

Figure 2:
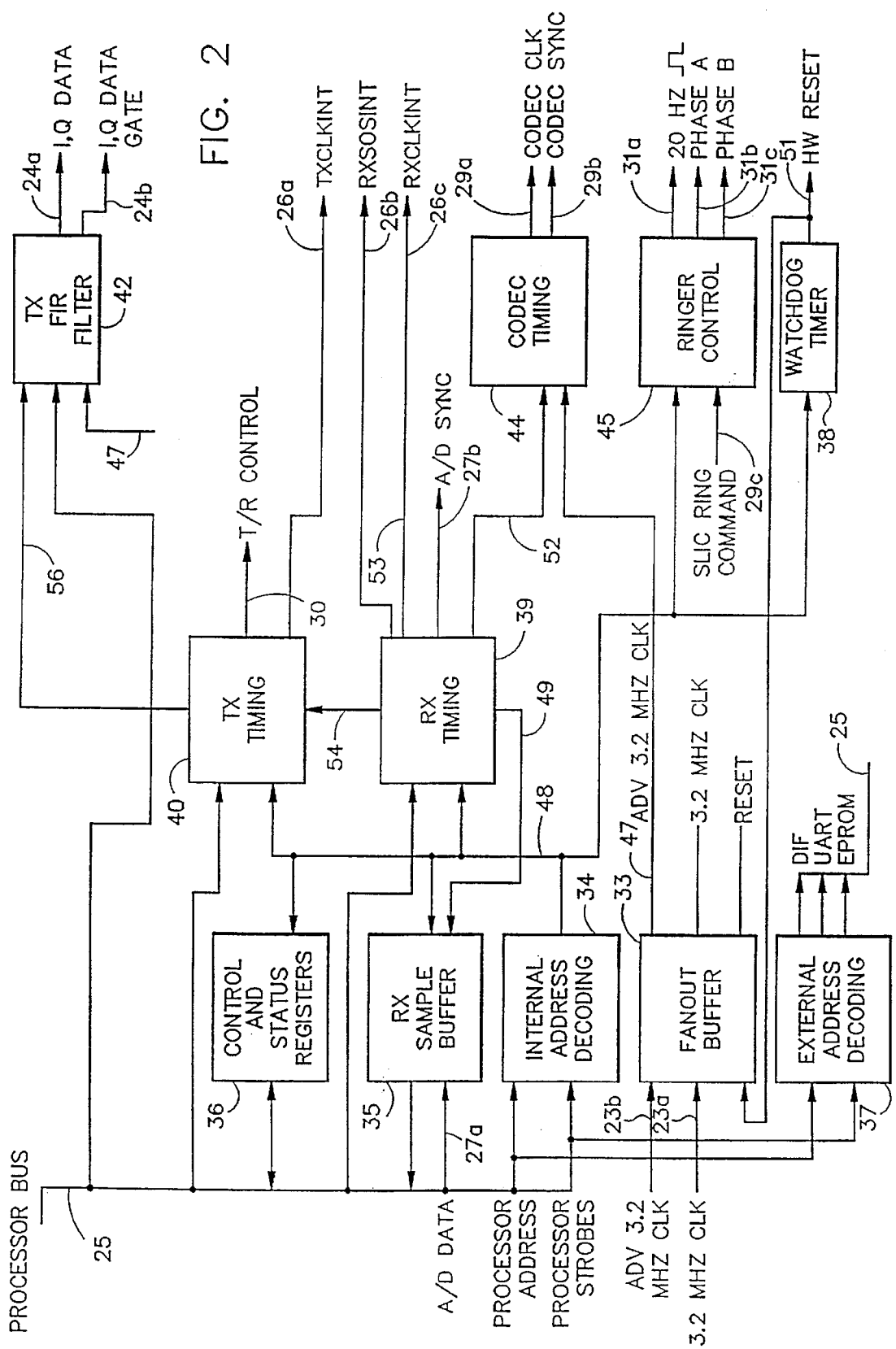
FIG. 2 is a block diagram of the FIR chip included in the embodiment shown in FIG. 1.

Referring to FIG. 2, the FIR chip 16 includes a fanout buffer 33, an internal decoding module 34, an RX sample buffer 35, control and status registers 36, an external address decoding module 37, a watchdog timer module 38, an RX timing module 39, a TX timing module 40, a TX FIR filter 42, a codec timing module 44, and a ringer control module 45.

The FIR chip 16 provides 45 millisecond frame marker generation, 11.25 millisecond slot marker generation, 16 KHz symbol clock generation, timing adjustment circuits, RX sample buffering, TX symbol buffering, 8 KHz codec timing generation, processor interface decoding, ringer timing generation, external address decoding and watchdog timer reset generation. The FIR chip 16 buffers two 5-bit TX symbols at a 8 KHz rate. The FIR chip 16 converts and filters the TX symbols into I and Q data symbols, with each such symbol being 10-bits at a rate of 160 KHz. The I and Q data are interleaved and output to the DIF chip 17 at a rate of 320 KHz. The FIR chip 16 also buffers RX data samples at a 64 KHz rate; and four RX data samples are read by the processor chip 12 at a 16 KHz rate. Timing clocks and signals are generated by the FIR chip 16 from an incoming 3.2 MHz master clock signal. The processor chip 12 is synchronized to these data rates by slot and symbol interrupts generated by the FIR chip 16. The codec and processor 8 KHz timing strobe and codec clock are generated by the FIR chip 16 and synchronized to the time of the incoming RX samples. The FIR chip 16 also generates control and timing signals for controlling the shape and timing of the ringing voltage provided by the ringer circuit 21. The watchdog timer module 38 provides a reset signal in the event that the processor chip 12 does not execute instructions properly.

The fanout buffer 33 buffers a 3.2 MHz master clock signal received on line 23a from the DIF chip 17, an advanced 3.2 MHz clock signal received on line 23b from the DIF chip 17, and a reset signal received on line 51 from the watchdog timer 38. Unless otherwise indicated, all timing within the FIR chip 16 is derived from the 3.2 MHz clock signal on line 23a. The advanced 3.2 MHz clock signal on line 23b leads the 3.2 MHz clock signal on line 23a by one cycle of a 21.76 MHz reference signal that is present within the DIF chip 17. The 3.2 MHz clock signal is derived frown the 21.76 Mhz reference in the DIF chip 17 and the minimum pulse width is therefore 276 nanoseconds. The advanced 3.2 MHz clock signal from line 23b is provided from the buffer 33 via internal line 47 to the TX FIR filter 42, and the codec timing module 44. The TX FIR filter 42 is implemented in part by a ROM, which is pseudo-static and requires its enable input to be deactivated by the advanced 3.2 MHz clock signal on line 47 between successive accesses.

The HW reset signal on line 51 resets all internal circuits of the FIR chip 16 and provides a hardware reset to the modules of FIG. 1.

The internal clocks are either buffered versions of the 3.2 MHz master clock signal received on line 23a or divisions of this clock.

The internal address decoding module 34 allows the processor chip 12 to access the internal functions of the FIR chip 16 for the purpose of controlling such functions and determining their status. The internal address decoding module 34 receives processor addresses and processor strobes on bus 25. The internal address decoding module 34 provides output signals on internal bus 48.

The output signals on bus 48 from the internal address decoding module 34 include a read enable signal to the RX sample buffer 35, a control write signal and status read signals to the control and status registers 36, a write signal to the TX FIR filter 42, slot and clock write signals to the RX timing module 39, a write signal to the TX timing module 40, and control signals to the TX FIR filter module 42 and the RX sample buffer 35, and an AM Strobe signal, which causes the RX timing module 39 to reset slot timing. Only one of the respective read or write signals on bus 48 from the internal address decoding module 34 is active at any one time.

The RX sample buffer 35 receives four samples for each RX symbol time from the A/D converter 19 via line 27a at a 64 KHz rate; buffers up to two symbols of data, which is eight samples total; and then sends such data samples to the processor chip 12 via the processor bus 25. The RX sample buffer 35 is implemented in a dual-page RAM. The RX sample buffer 35 receives a read enable signal on internal bus 48 from the internal address decoding module 34 and a write strobe signal on internal line 49 from the RX timing module 39.

The control and status registers 36 allow the processor chip 12 to control the internal functions of the FIR chip 16, and allow the processor chip 12 to read the status of the TX FIR filter 42 and RX sample buffer 35, and other internal signals. The control signals are provided by the processor chip 12 via the processor bus 25.,and the status indications are derived from various internal modules of the FIR chip 16. The status indications are provided to the processor chip 12 via the processor bus 25. The status indications are RX Underrun RX Overrun, TX Underrun, TX Overrun, Start-of-Frame, RX Start of slot, TX symbol Clock, RX Symbol Clock and TX FIR filter Overflow.

The control signals, which are provided by the control registers 36 to the internal circuits via the internal bus 48, include the following: TX Enable, Modulation Level, Ringer Enable, Software Reset, Tristate, and Watchdog Strobe.

The TX Enable signal indicates the beginning of a TX slot based upon the TX delay established in the TX timing module 40.

The Modulation Level signal is provided to the RX timing module 39 and determines whether a slot length is 180 or 360 symbols.

The Software Reset signal allows the processor chip 12 to reset internal functions within the FIR chip 16.

The Tristate signal allows the processor chip 12 to disable the outputs of the FIR chip 16.

The Ringer Enable signal allows the processor chip 12 to turn the ringer circuit 21 on and off. This signal provides a two-second and four-second cadence for the ringing signal.

The Watchdog Strobe allows the processor chip 12 to reset the watchdog timer module in order to keep a hardware reset from occurring.

The processor chip 12 receives a RX clock interrupt (RXCLKINT) signal from the RX timing module 39 via line 26c when data has been written into the first four locations of the dual-page RAM of the RX sample buffer 35. The processor chip 12 then reads the RX samples from the first four locations of the dual-page RAM via processor bus 25. At this time samples are being written into the next four locations of the dual-page RAM at a 64 KHz rate. The 16 KHz event is a derivative of the 64 KHz event, which keeps the read and write events synchronized. This ensures that read and write operations do not occur at the same time at any one memory location and also ensures adequate response time from the processor chip 12.

A TX symbol buffer in the TX FIR filter 42 receives TX symbols from the processor chip 12 via the processor bus 25 and buffers up to two TX symbols. The processor chip 12 is interrupted every other TX symbol time to write two more symbols into the TX symbol buffer.

The TX symbol buffer in the TX FIR filter 42 receives a write signal via the internal bus 48 from the internal address decoding module 34.

After each TX clock interrupt (TXCLKINT) signal at 8 KHz on line 26a, the processor chip 12 writes out two 5-bit TX symbols. The data is in a DPSK gray code format. The TX symbol buffer outputs a symbol every 16 KHz for processing by the TX FIR filter 42. This data is double buffered due to an asynchronism between the FIR chip 16 and the processor chip 12. The last data value is repeated until new data is written. Null data can be repeated in this manner. The TX symbol buffer is cleared during a reset.

During training, a fixed sequence of symbols is sent to the FIR chip 16 by the processor chip 12. The FIR chip 16 performs FIR filtering on these symbols and outputs I,Q pairs to the DIF chip 17.

The radio 20 loops the data back to the A/D converter 19. The samples are read by the processor chip 12 as in the on-line mode and the coefficients of the processor RX filter implemented in the processor chip 12 are adjusted. The only timing critical for training is generated by the RX and TX timing modules 39, 40.

The RX timing module 39 generates all reference clocks and strobes for processing the RX symbols. The timing is adjusted by the processor chip 12 so that processing can be synchronized to the RX samples received via line 27a from the base station. The RX timing module 39 includes an RX clock fractional timing circuit and an RX Slot timing circuit. The purpose of these two circuits is to synchronize the modem receive timing within the processor chip 12 to the RX samples received on line 27a from the base station, and via the A/D converter 19, and also to regulate the TX timing module 40 and the codec timing module 44.

The RX timing module 39 is clocked at a 3.2 MHz rate and receives the following control signal inputs from the processor chip 12 via the processor bus 25: an AM Strobe signal, an RX Slot Clock Write signal, and an RX Bit Tracking signal.

Several outputs are generated by the RX timing module 39. A 64 KHz write strobe is provided on line 49 to control writing to the RX sample buffer 35. A 64 KHz A/DSYNC strobe signal is provided on line 27b to the A/D converter 19 to synchronize the operation thereof. A 8 KHZ strobe signal also is provided to the codec timing module 44 via line 52. A 16 KHZ RX clock interrupt (RXCLKINT) signal on line 26c and RX start-of-slot interrupt (RXSOSINT) signal on line 26b are output to the processor chip 12. A pre-RX slot timing strobe is provided on line 54 to control the TX timing module 40.

The fractional timing circuit in the RX timing module 39 is set by the processor chip 12 to generate the RX start of slot interrupt signal on line 26b. The processor chip 12 determines the location of an AM hole (strobe signal) transmitted by the base station during acquisition. When the processor chip 12 detects the AM strobe signal, the slot timing circuit in the RX timing module 39 is reset by a reset signal from the processor chip 12. This aligns the frame and slot markers to the AM strobe signal. The frame marker is a 62.5 μsec. pulse occurring every 45 milliseconds. The slot marker is a 62.5 sec. pulse repeating every 11.25 millisecond, or 22.5 milliseconds when in a QPSK mode.

The incoming RX symbols are demodulated by the processor chip 12 and timing is further adjusted if necessary. To adjust the 16 KHz RX symbol clock the processor chip forces the fractional timing (bit tracking) circuit to shorten or lengthen the 64 KHz strobe by up to fifty 3.2 MHz cycles.

The processor chip 12 monitors the relationship of the RX symbols to the frame timing and makes adjustments to the 16 KHz RX clock accordingly. When the RX clock is adjusted the slot and frame markers are changed also because they are a derivative of the RX clock.

To keep the number of Pulse Code Modulated (PCM) samples provided to and from the SLIC and codec circuit 11 synchronized to the frame timing, the RX timing module 38 controls the codec timing module 44.

The TX timing module 40 includes a TX delay circuit and a TX control timing circuit. These circuits generate a TX clock interrupt (TXCLKINT) signal which is provided to the processor chip 12 via line 26a. The TX timing module 40 is synchronized to the RX timing module 39 by the pre-RX slot timing strobe, which is provided to the TX timing module by the RX timing module 39 on line 54 and used to reset the TX delay circuit, which in turn generates the TX slot marker. Timing of the TX clock is based on the internal 3.2 MHz clock.

The processor chip 12 also controls the TX delay and TX timing circuits by providing TX data write control signals over the processor bus 25.

The TX timing module 40 provides a T/R control signal on line 30 to the radio 20. This signal determines whether the radio is transmitting or receiving data.

The TX timing module 40 also controls TX symbol shifting, ROM addressing, accumulation timing, and I,Q product storage for output to the DIF chip 17.

The TX timing module 40 provides control signals on line 56 for keeping the TX FIR filter 42 synchronized to the TX symbol and slot timing. Such synchronization is accomplished in accordance with the TX slot timing marker. After a reset, the TX timing module 40 actively generates control signals onto line 56 once a TX slot begins.

The TX FIR filter 42 module includes a ROM, which implements a FIR filter by providing I and Q data products in response to the ROM being addressed for lookup by a combination of TX symbols received from the processor chip 12 via the processor bus 25 and SINE and COSINE coefficient counts provided by a counter within the TX FIR filter module 42. The TX FIR filter 42 accumulates six sequential I and Q data products and stores results for output to the DIF chip 17 via line 24a.

The minimum frequency required for operation of the TX FIR filter 42 is determined by the symbol rate (16 KHz) times the number of I and Q samples (2) times the number of coefficients (10) times the number of taps (6)=1.92 MHz. The master clock of 3.2 MHz meets this minimum frequency requirement. Wait periods are added to compensate for the faster execution time.

The TX timing module 40 is clocked at a 3.2 MHz clock rate, which defines one state period. Because this clock rate is greater than the required minimum of 1.92 MHz the TX FIR filter 42 generates signals for the first six out of ten state periods.

Each new TX symbol must be loaded into a circular buffer in the TX FIR filter 42 at the rate of 16 KHz. The new TX symbol and the previous five TX symbols are stored in the circular buffer. The oldest TX symbol is dropped when a new TX symbol is shifted in. The TX FIR filter 42 output rate is 320 KHz. From each TX symbol, ten I data values are generated and ten data values are generated. Table 1 below shows how I, Q and null information can be derived from each 5-bit value.

TABLE 1

| BIT 1 | BIT 2 | BIT 3 | BIT 4 | BIT 5 |
|---|---|---|---|---|
| I & Q LSB | I & Q | I MSB | Q MSB | NULL |

The data in the circular buffer is rotated every 6 out of 10 states. One new TX symbol and the five previous TX symbols reside in the circular buffer for twenty of these ten state periods. The coefficient portion of the ROM address is also increased every six out of ten state periods. An accumulator in the TX FIR filter 42 adds the results of each I-data product provided from the ROM for each of the six state periods. Therefore the accumulator register is cleared for the first addition, and each successive addition result is clocked into a feed back register of the accumulator so it can be added to the newly looked-up product. Once six additions occur the result is clocked into an output shift register. The same process occurs for the same coefficients and the Q-data products provided from the ROM for each TX symbol.

The ROM address lines allow sixty COS coefficient and sixty SIN coefficient lookups for four possible I,Q data indexes. This requires seven address lines for coefficients and two address lines for I,Q data. The output of the FIR filter requires 10 bits. Two extra bits are required to maintain accuracy of the fractional portion of the lookup value. This makes the ROM size 512×12. The MSB of the I,Q data index is passed around the ROM to a 1s complement circuit which forces the output of the ROM to be inverted or not inverted.

If the symbol addressing the ROM is a null symbol the null bit controls four of the seven coefficient address lines. Since seven address lines are used for coefficient lookup this provides 128 locations. Only 120 coefficients are needed. This leaves eight unused locations. Zero values are stored in these locations so null information can be easily output from the ROM.

A 2's complement function is implemented by using a 1's complement and carrying in a logic 1 in the succeeding adder. The output of the adder is wrapped around to the input of the adder for successive additions or output through a MUX to an output shift register. The output is rounded off by using only the ten upper bits.

The circular buffer outputs of the TX FIR filter are set to zero after a reset. This allows null information to be processed until new TX symbol values are loaded. I data is first processed followed by Q data.

The TX Clock interrupt signal only occurs during a TX slot. The processor does not know when a TX slot begins or ends except by responding to this interrupt. The signal has an active low duration of one 3.2 MHz clock cycle to guarantee that the interrupt is not active once it has been serviced. The TX Clock interrupt occurs every other symbol time (16 KHz/2).

The RX Clock interrupt occurs for a full frame. The processor chip 12 masks out this interrupt by using the RX Slot marker as a mask. The RX Clock interrupt has an active low duration of one 3.2 MHz clock cycle.

The RX Start of Slot interrupt occurs every 11.25 milliseconds, and has an active low duration of one 3.2 MHz clock cycle.

Each interrupt signal is forced to an inactive high state upon reset.

The codec timing module 44 generates timing strobes and sends the necessary clock signal via lines 29 to the SLIC and codec circuit 11 to cause 8 bits of data to be transferred between the codec and processor at an 8 KHz rate. The codec 11 receives and transmits 8 bits of data every 8 KHz. The codec timing module 44 sends a codec clock, signal on line 29a and a codec sync signal on line 29b. The codec clock signal on line 29a is generated at a rate of 1.6 MHz by dividing the advanced 3.2 Mhz clock by two. An 8 KHz pulse of one 3.2 MHz period is received from the RX timing circuit 39 and is reclocked to occur for one 1.6 MHz period, and Thus is guaranteed to occur with respect to the 1.6 MHz clock rising edges. With these two signals, transfer of PCM data between the codec 11 and the processor chip 12 is accomplished. This allows the subscriber PCM data to be synchronized to the base station PCM data.

The ringer control module 45 responds to a ring enable control signal originating in the processor chip 12 and provided from the control and status register 36 on internal bus 48 by generating a 20 Hz square wave signal on line 31a and two 80 KHz phase control signals, PHASEA on line 31b and PHASEB on line 31c and sending these signals to the ringer circuit 21. The 20 Hz square wave signal on line 31a controls the polarity of the ringer voltage provided by the ringer circuit 21 to the telephone interface circuit 10. The 80 KHz phase signals on lines 31b and 31c control the pulse width modulated power source in the ringer circuit 21.

A reset or a SLIC ring command signal on line 29c from the SLIC portion of the SLIC and codec circuit 11 turns off or overrides these signals on lines 31a, 31b, and 31c after the ring enable signal originating in the processor chip 12 has turned them on. This ensures that the ringer is off if a reset occurs or the telephone hand set is taken off hook.

Since the ringer circuit 21 generates a high voltage and dissipates much power, this voltage is not generated except when requested by the processor chip 12.

The external address decoding module 37 generates chip selects onto the processor bus 25 that are used by the processor chip 12 to access the DIF chip 17, the UART hardware, and the slow memory EPROMs 14 in separate distinct address segments. The processor chip 12 provides eight MSB address lines, data space, and program space signals. These are decoded to generate the appropriate chip selects.

The watchdog timer module 38 generates a 50 millisecond hardware reset pulse on line 51, which resets all FIR chip 16 modules and all subscriber unit modules in FIG. 1. The watchdog timer module 38 generates a pulse if it is not reset within a 512 millisecond period by the Watchdog strobe signal provided on bus 48 by the control and status registers 36.

The DIF chip 17 is interfaced to the processor chip 12 by the processor bus 25, to the FIR chip 16 by lines 23 and 24, to the DAC 18 by line 71 and to an oscillator in the radio 20 by line 72.

The oscillator in the radio 20 provides a 21.76 Mhz master clock signal on line 72 to the DIF chip 17.

Figure 3:
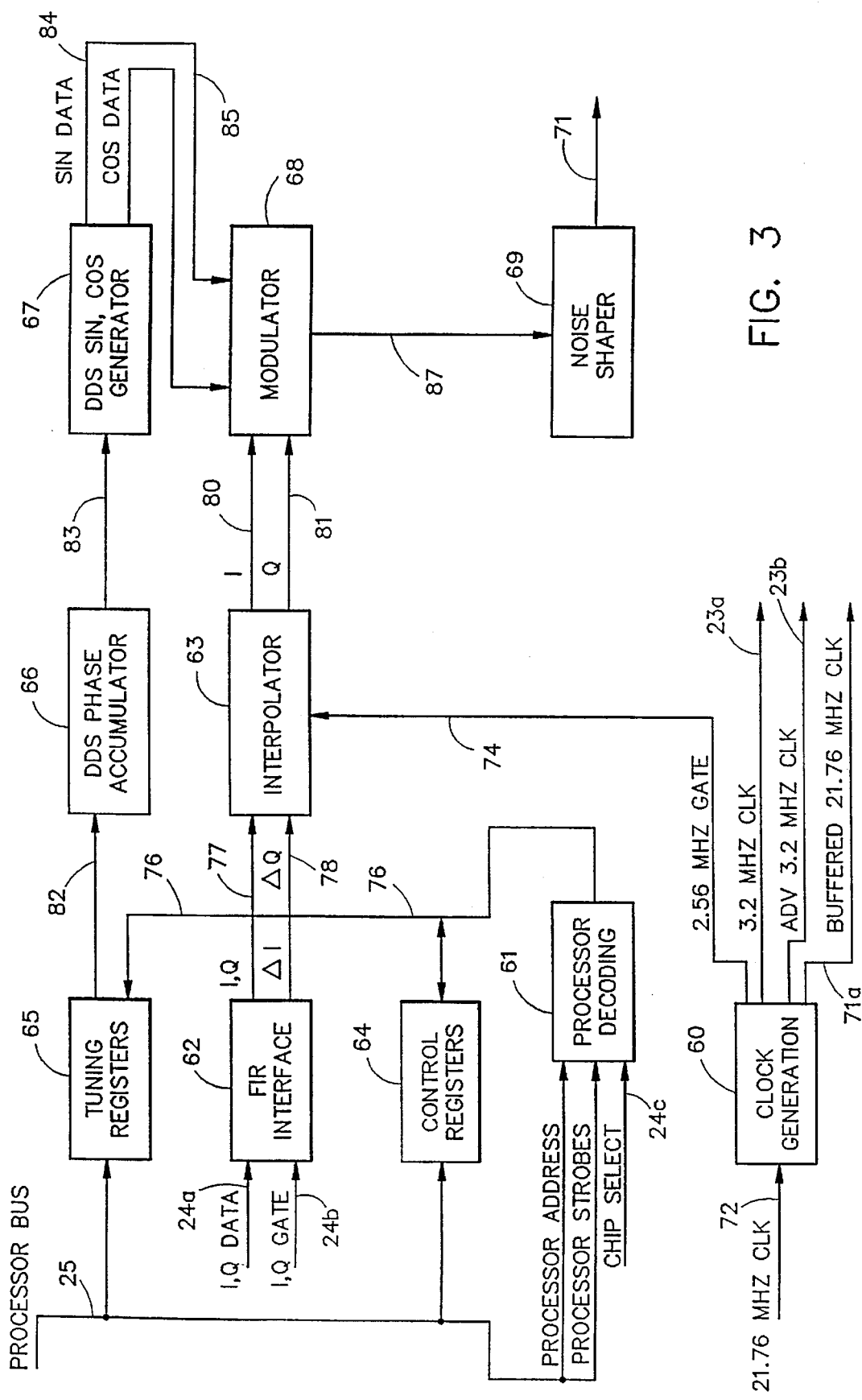
FIG. 3 is a block diagram of the DIF chip included in the embodiment shown in FIG. 1.

Referring to FIG. 3, the DIF chip 17 includes a clock generator 60, a processor decoding module 61, a FIR chip interface module 62, an interpolator 63, a control register 64, tuning registers 65, a DDS phase accumulator 66, a DOS SIN and COS generation module 67, a modulator 68 and a noise shaper 69. In combination the DOS phase accumulator 66 and the DDS SIN, COS generator 67 constitute a direct digital synthesizer (DDS) for digitally synthesizing a digital intermediate frequency signal.

The DIF chip 17 is an ASIC chip, which is mapped as processor data memory.

The DIF chip 17 operates in one of two operating modes, a modulated carrier generation mode, and a pure carrier mode. In the modulated carrier generation mode, baseband data is input in the I,Q domain and this data is used to modulate the pure carrier generated by the DDS function of the DIF chip 17. In the Pure Carrier Generation mode, the baseband data inputs are ignored and an unmodulated carrier from the DDS is provided to the DAC 18.

The clock generator 60 generates all timing and crocks within the DIF chip 17 and also generates the 3.2 MHz clock signal and the advanced 3.2 MHz clock signal that are provided to the FIR chip 16 on lines 23a and 23b. The two primary timing signals used within the DIF chip 17 are a 21.76 MHz clock and a 2.56 MHz interpolation gate signal. The 3.2 MHz clock is used internally to shift and Q data on line 24a from the FIR chip 16 into the FIR interface module 62.

The clock generator 60 buffers the 21.76 MHz clock received on line 72 from the oscillator in the radio 20 and provides a buffered 21.76 clock signal on line 71a. Such buffering is done to provide sufficient drive capability for internal functions and to minimize clock skew. The buffered 21.76 Mhz clock, also provides a clock for the DAC 18 and other external circuitry.

The clock generator 60 provides the 3.2 MHz clock signal by dividing the 21.76 Mhz clock by 6 and by 8 in the following sequence: 6-8-6-8-6, which thereby results in an average divisor of 6.8 (21.76÷6.8=3.2). The effect of this per cycle variation is a minimum period of 276 ns and a maximum period of 368 ns. An advanced version of the 3.2 MHz clock signal is also generated as the advanced 3.2 MHz clock signal on line 23b. Both clocks are identical with the exception that the ROM deselect signal on line 23b leads the 3.2 MHz clock signal on line 23a by one 21.76 MHz clock cycle.

The clock generator 60 provides the 2.56 MHz gate signal on internal line 74 by dividing the 21.76 Mhz clock, by 8 and 9 in an even sequence (8-9-8-9- . . . ), which thereby results in an average divisor of 8.5 (21.76 ÷8.5=2.56 MHz). This signal is used by the interpolator 63 and the modulator 68.

The processor decoding module 61 allows the processor to control all internal functions of the DIF chip 17. The processor decoding module 61 decodes processor addresses and processor strobes received from data space on the processor bus 25 to provide internal write strobes, which are provided on internal bus 76 to the control register 64 and the tuning registers 65 to enable the processor chip 12 to write control and configuration data. Only one output from the processor decoding module 61 is active at any given time. The processor addresses determine which output is generated. If a function within the DIF chip 17 address space is chosen, a chip select signal on line 24c from the FIR chip 16 becomes active.

The FIR interface module 62 receives the I and Q samples from the FIR chip 16 on line 24a in a serial format and converts them into 10-bit parallel format in which they are provided to the interpolator module on line 77. The I,Q gate signal on line 24b from the FIR chip 16 is used to distinguish the I data from the Q data. The FIR interface module 62 also subtracts previous I and Q samples from current samples to form a Δ I and ΔQ samples which are then shifted right 4 places (÷16) to form the correct increment for the interpolator module on line 78. Since the FIR interface module 62 supplies data to the interpolator 63, a sync signal is sent by the. FIR interface module 62 to the clock generator 60 to synchronize the 2.56 MHz gate pulse provided on line 74.

The interpolator 63 accumulates the Δ I,Q at a 160 KHz ×16=2.56 MHz rate and provides interpolated I and Q samples to the modulator 68 on lines 80 and 81 respectively. The interpolator 63 performs a ×16 linear interpolation in order to reduce the 160 KHz sampling spurs present in the baseband data received from the FIR chip 16.

The interpolator 63 successively accumulates the Δ I and Δ Q samples to generate an output at a 2.56 MHz rate. At the end of an accumulation cycle (16 iterations), the output of the interpolator should be equal to the current I and Q samples. This is critical since the next accumulation cycle starts its cycle with the current data. To ensure that the data is correct, during the last accumulation cycle the current I and Q data are input directly to the interpolator output register in place of the output of the adder (which should have the same data).

The control registers 64 are used to control and configure the DIF chip 17 and to select the operating modes. All of the control registers 64 are loaded by the processor chip 12 via the processor bus 25.

There are three control registers 64. The first control register registers a CW MODE signal, an AUTO TUNE H-L signal, and an AUTO TUNE L-H signal. The second control register registers a SIGN SELECT signal, an OUTPUT CLOCK PHASE SELECT signal, an INTERPOLATOR ENABLE signal, a SERIAL PORT CLOCK SELECT signal, a SERIAL/PARALLEL MODE SELECT signal and a QUADRATURE ENABLE signal. The control functions associated with these signals are described later at the conclusion of the description of the other modules of the DIF chip 17.

The third control register enables and specifies the coefficients for the noise shaper 69.

There are three 8-bit tuning registers 65 for storing 24 bits of phase increment data to specify the frequency of the DDS. This provides a 24-bit tuning word which allows a frequency resolution of (sample rate)/$2^{24}$=21.76 MHz/$2^{24}$≈1.297 Hz. The output frequency of the DDS is equal to the resolution multiplied by the 24-bit tuning word.

The tuning registers 65 are loaded by the processor chip 12 via the processor bus 25. The tuning word is double buffered by the tuning registers 65 so that the processor chip 12 can write data to these registers freely without affecting the current DDS operation.

The tuning word in loaded from buffer tuning registers into output tuning registers whenever a TUNE command is issued. The TUNE command is synchronized to the 21.76 Mhz clock to provide a synchronous transition.

The DDS phase accumulator 66 performs a modulo $2^{24}$ accumulation of the phase increment provided on line 82 by the tuning registers 65. The output of the phase accumulator 66 represents a digitized phase value which is provided on line 83 to the DDS SIN and COS generator 67. The DDS SIN and COS generator 67 generates a sinusoidal function. A DDS works on the principle that a digitized waveform may be generated by accumulating phase changes at a higher rate.

The tuning word, which will be different for different subscriber units, represents a phase change to the phase accumulator 66. The output of the accumulator 66 can range from 0 to $2^{24}-1$. This interval represents a 360 degree phase change. Although the accumulator 66 works in standard binary, this digitized phase representation can be input to a waveform generator to produce any arbitrary waveform. In the DIF chip 17, the DDS SIN and COS generators 67 produce SIN and COS functions on lines 84 and 85 respectively.

The period of the waveform function is based on the time required to perform a summation to the accumulator upper limit ($2^{24}-1$). This means that if a large phase increment is provided, then this limit will be reached sooner. Conversely, if a small increment is given then a longer time is required. The phase accumulator 66 performs a simple summation of the input phase increment and can be represented by the following equation:

$$\phi_T = \sum_{i=1}^{n} \phi_{inc} \quad \{\text{Eq. 1}\}$$

Where n is the number of iterations, and $\phi_{inc}$ is simply the data provided on line 82 from the tuning registers 65.

In the embodiment of the DIF chip 17 described herein, the value of $\phi_T$ is constrained by the accumulator length to be a maximum of $2^{24}$. Therefore the current phase may be described as:

$$\phi_t = (\phi_{t-1} + \phi_{inc}) \bmod 2^{24} \quad \{\text{Eq. 2}\}$$

Since the accumulation clock is fixed to be the master 21.76 MHz input clock this results in a complete cycle taking $2^{24}/\phi_{inc}$ iterations at a per iteration period of 1/21.76 MHz. So the entire cycle takes the following amount of time:

$$\frac{2^{24}}{21.76 \text{ MHz} \cdot \phi_{inc}}$$

Since this period represents a 360 degree cycle, the reciprocal of this expression represents a frequency. The DDS frequency is therefore $$f_{DDS} = \frac{21.76 \text{ MHz} \cdot \phi_{inc}}{2^{24}} \quad \{\text{Eq. 3}\}$$

Figure 6:
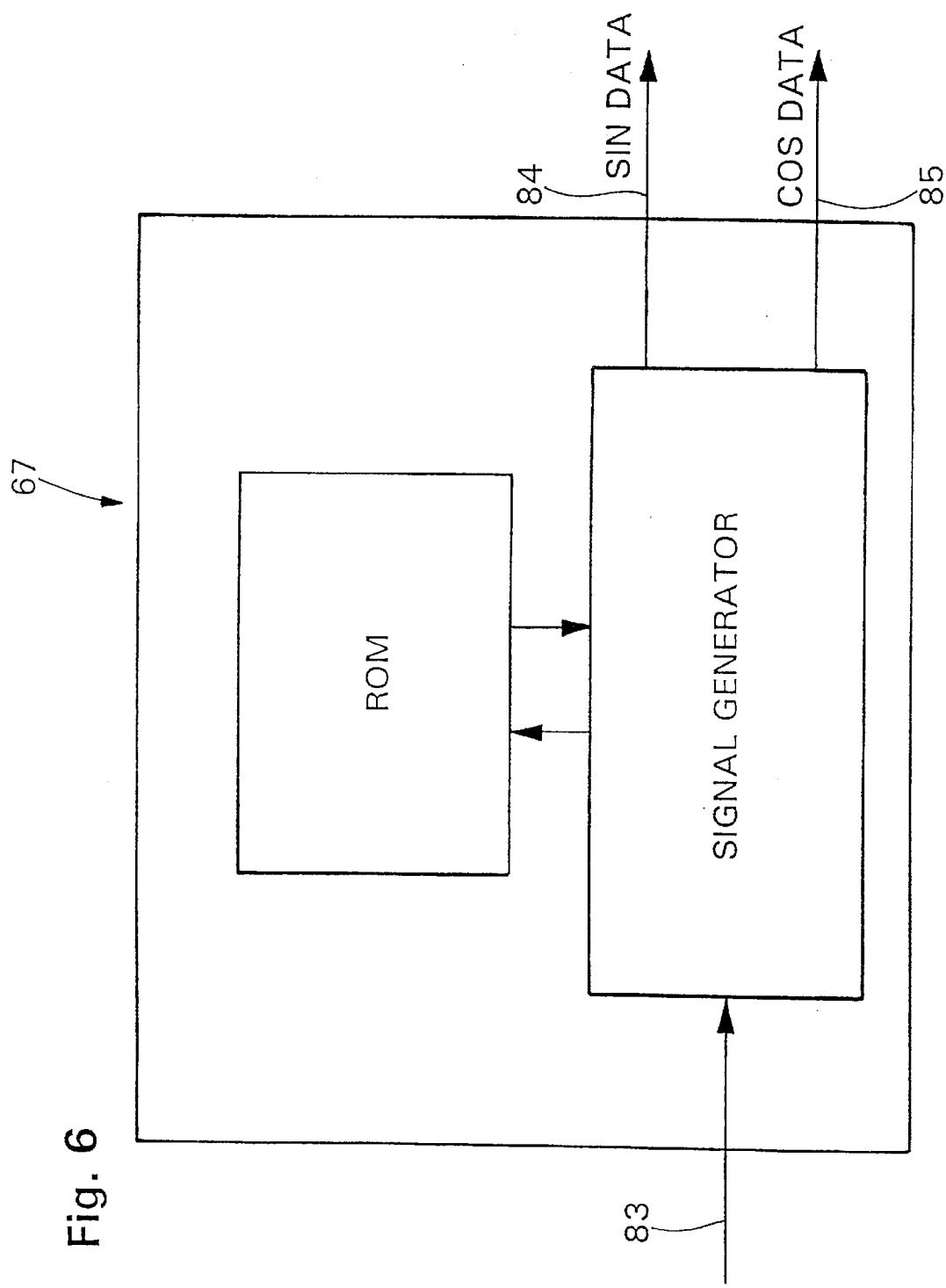
FIG. 6 illustrates the direct digital synthesizer in detail.

In the DDS SIN, COS generation module 67, the SIN and COS waveforms are generated so a complex mixing may be performed in the modulator, Each is generated by two lookup tables representing a coarse and fine estimate of the waveform. The two values are added to form composite 12-bit signed 2's complement SIN and COS data output signals on lines 84 and 85. The lookup tables are implemented in ROM's that are addressed by the fourteen most significant bits of the signal on line 83 from the DDS phase accumulator 66. FIG. 6 shows the DDS sine, cosine generator 67 in greater detail.

It is desired to have as much phase and amplitude resolution as is practical. In the DIF chip 17 design, 14 bits of phase input and 12 bits of amplitude data output are provided in the waveform generation section. If a "brute-force" approach were taken to generate this data then very large tables would be needed to generate all possible phase and amplitude values (e.g. 16K words ×12 bits each). To minimize the table size, the DIF chip 17 makes use of quadrant symmetry and trigonometric decomposition of the output data.

Since SIN and COS waveforms have quadrant symmetry, the two most significant bits of the phase data are used to mirror the single quadrant data around the X and Y axis. For the SIN function the amplitude of the wave in the π to 2π interval is just the negative of the amplitude in the 0 to π interval. For the COS function the amplitude of the wave in the π/2 to 3π/2 interval is just the negative of the amplitude in the 3π/2 to π/2 interval. The two MSBs of the phase accumulator specify the quadrant (00→1, 01→2, 10→3, 11→4). For the SIN function, the MSB of the phase data is used to negate the positive data generated for the first two quadrants. For the COS function, an XOR of the two phase data MSBs is used to negate the positive data generated for quadrants 1 and 4.

The above technique reduces memory requirements by a factor of 4. This still results in a memory requirement of 4K words ×12 bits. To reduce the table sizes further, a trigonometric decomposition is performed on the angles. The following trigonometric identity is used:

$$\sin \theta = \sin (\phi_1 + \phi_2) = \sin \phi_1 + \cos \phi_2 + \sin \phi_2 \cos \phi_1 \quad \{\text{Eq.4}\}$$

Letting $\phi_2 \ll \phi_1$ leads to the complete approximation as follows:

$$\sin \theta = \sin \phi_1 + \sin \phi_2 \cos \hat{\phi}_1 \quad \{\text{Eq.5}\}$$

It is not necessary to use all bits of $\phi_1$ when computing the second term of the equation so $\hat{\phi}_1$ is a subset of $\phi_1$.

To generate the COS function, the same approximation may be used since $$\cos \theta = \sin (\theta + \pi/2) \quad \{\text{Eq.6}\}$$

This results in a modification of the $\phi_1$ & $\hat{\phi}_1$ variables when computing the COS function. The data stored in the COS ROMs will incorporate this angle modification so no changes to the phase data are required.

The modulator 68 mixes the interpolated I and Q samples on lines 80 and 81 with the digital intermediate frequency signal represented by the complex SIN and COS function data on lines 84 and 85 to produce a modulated digital intermediate frequency signal on line 87.

The interpolated I,Q samples and DDS output are digitally mixed by two 10×12 multipliers. The outputs of the mixing process are then summed by a 12 bit adder to form a modulated carrier. It is possible to alter the operation of the modulator 68 by forcing the I input to all zeroes and the Q input to all ones. The effect of this is that one multiplier will output all zeroes and the other will output the signal from the DDS SIN, COS generator 67 only. The sum of these two signals yields an unmodulated digital intermediate frequency signal.

The modulator 68 creates a modulated digital intermediate frequency signal on line 87 according to the following equation:

$$f(t) = I \cdot \cos (\phi(t)) + Q \cdot \sin (\phi(t)) \quad \{\text{Eq.7}\}$$

The 12-bit output of the DDS SIN and COS generator 67 is multiplied by the 10 bit interpolated I and Q samples from the interpolator 63 to generate two 12-bit products. The two products are then added (combined) to generated a 12-bit modulated output on line 87.

Since both the I multiplier and the Q multiplier generate 12-bit products, it is possible that an overflow could occur when their outputs are combined. Therefore it necessary to ensure that the magnitude of the vector generated by I and Q never exceeds 1 (assuming |I|, |Q| are fractional numbers ≦1). If this is not ensured then an overflow of the modulator adder is possible.

The noise shaper 69 provides a filtered modulated or unmodulated digital intermediate frequency signal on line 71 to the DAC 18. The noise shaper 69 is designed to decrease the amount of noise power in the output spectrum caused by amplitude quantization error.

The noise filter 69 works on the fact that the quantization noise is a normal random process, and the power spectral density of the process is flat across the frequency band. The desired output signal is overlayed on top of this quantization noise floor. The noise shaping device is a simple multitap finite impulse response (FIR) filter. The filter creates a null which decreases the quantization noise power in a certain part of the frequency band. When the desired signal is overlayed on the filtered noise spectrum, the effective SQNR increases.

The FIR filter transfer function is given by $$H(z)=1+bz^{-1}-z^{-2} \qquad \{\text{Eq. 8}\}$$

A two adder stage creates a second tap value of b in the range of +1.75 to −1.75 (in binary weights of 0.0.25, 0.50, 1.0) that will move the zero of the filter across the output frequency band, so that it may be placed as near as possible to the desired output frequency for maximum SQNR performance.

The null frequency can be computed by solving for the roots of the above equation in the z-plane. The roots are a complex conjugate pair that reside on the unit circle. The null frequency is given by the relation:

$$f_{null}=\frac{\theta}{360°} \cdot f_{sampling} \qquad \{\text{Eq. 9}\}$$

where θ is the angle of the root in the upper half plane. The conjugate root will provide a null reflected around the Nyquist frequency.

Table 2 lists null frequencies generated by the binary weighted second tap. Let b3, b2, and b1 correspond to the weights 1.0 0.5 0.25, a "+" symbol means the tap is equal to its weight, a "−" symbol means that the tap is equal to the negative of its weight, and. '0' means that the tap has no weight. Some of the null frequencies are equal to those of other combinations, simply because the possible combinations sometimes overlap (e.g. 1.0+0.5−0.25=1.0+0.0+0.25). $f_{sample}$ is 1.00.

TABLE 2

| b3 | b2 | b1 | f(null) | f(alias) |
|----|----|----|---------|----------|
| 0  | 0  | 0  | 0.250   | 0.750    |
| 0  | 0  | −  | 0.269   | 0.731    |
| 0  | 0  | +  | 0.230   | 0.770    |
| 0  | +  | 0  | 0.210   | 0.790    |
| 0  | +  | +  | 0.188   | 0.812    |
| 0  | +  | −  | 0.230   | 0.770    |
| 0  | −  | 0  | 0.290   | 0.710    |
| 0  | −  | +  | 0.269   | 0.731    |
| 0  | −  | −  | 0.312   | 0.688    |
| +  | 0  | 0  | 0.167   | 0.833    |
| +  | 0  | −  | 0.188   | 0.812    |
| +  | 0  | +  | 0.143   | 0.857    |
| +  | +  | 0  | 0.115   | 0.885    |
| +  | +  | +  | 0.080   | 0.420    |
| +  | +  | −  | 0.143   | 0.857    |
| +  | −  | 0  | 0.210   | 0.790    |

TABLE 2-continued

| b3 | b2 | b1 | f(null) | f(alias) |
|----|----|----|---------|----------|
| +  | −  | +  | 0.188   | 0.812    |
| +  | −  | −  | 0.230   | 0.770    |
| −  | 0  | 0  | 0.333   | 0.667    |
| −  | 0  | −  | 0.357   | 0.643    |
| −  | 0  | +  | 0.312   | 0.688    |
| −  | +  | 0  | 0.290   | 0.710    |
| −  | +  | +  | 0.269   | 0.731    |
| −  | +  | −  | 0.312   | 0.688    |
| −  | −  | 0  | 0.385   | 0.615    |
| −  | −  | +  | 0.357   | 0.643    |
| −  | −  | −  | 0.420   | 0.580    |

All timing is derived from the 21.76 MHz clock signal on line 71a.

The functions associated with the signals in the control registers 64 are now described.

When the CW MODE signal is set, the I input to the respective multiplier in the modulator 68 is forced to all zeroes, and the corresponding Q input forced is to all ones. The net effect is that an unmodulated carrier will be generated. This function is double buffered and the loaded data will not become active until a TUNE command is-issued.

The INTERPOLATOR ENABLE signal enables the ×16 interpolator on the I,Q samples. If the INTERPOLATOR ENABLE signal is not set then the I,Q data is input directly to the multiplier.

External memory required for the operation of the processor chip 12 is provided by a fast memory 13 and a slow memory 14. The fast memory 13 is accessed by an address decoder 15. The fast memory 13 is a cache memory implemented in a RAM having zero wait states. The slow memory 14 is a bulk memory that is implemented in an EPROM, having two wait states. The slow memory 14 is coupled to the processor chip 12 for storing processing codes used by the processor chip 12 when said codes need not be operated with zero wait states; and the fast memory is coupled to the processor chip 12 for temporarily storing processing codes used by the processor chip 12 when said codes are operated with zero wait states. When procedures must be run with zero wait states, the code can be uploaded from the slow memory 14 to the fast memory 15 and run from there. Such procedures include the interrupt service routines, symbol demodulation, RCC acquisition, BPSK demodulation, and voice and data processing.

Figure 4:
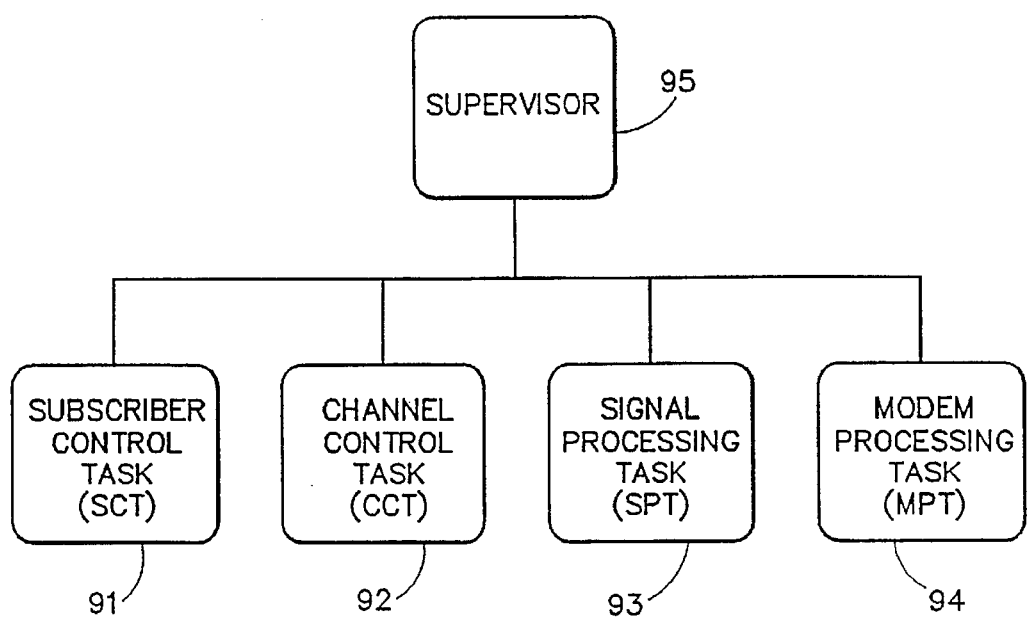
FIG. 4 illustrates the processing tasks performed by the processor chip shown in the embodiment of FIG. 1.

The processor chip 12 includes a single model TMS320C25 digital signal processor, which performs four main tasks, a subscriber control task (SCT) 91, channel control task (CCT) 92, a signal processing task (SPT) 93, and a modem processing task (MPT) 94, as shown in FIG. 4. These four tasks are controlled by a supervisor module 95. The SCT deals with the telephone interface and the high-level call processing. The CCT controls the modem and RELP operation and timing, and performs power-level and TX timing adjustments according to requests from the base station. The SPT performs the RELP, echo cancellation and tone generation functions. The supervisor calls these four tasks sequentially and communicates with them via control words.

The SCT 91 provides the high level control function within the subscriber unit and has three fundamental modes of operation: idle, voice and abort.

The SCT enters Idle Mode after power up and remains in that state until an actual voice connection is made. While in the idle Mode, the SCT monitors the subscriber telephone interface for activity and responds to base station requests received over the radio Control channel (RCC).

The primary function of the SCT is to lead the Subscriber Unit through the setup and teardown of voice connections on a radio channel. Before the unit can set up any kind of call, however, it must find the correct base station. The SCT determines which RCC frequency to use, and sends the frequency information to the CCT. A description of the initialization of a communication channel between the subscriber unit and the base station is contained in U.S. patent application Ser. No. 07/070,970 filed Jul. 8, 1987, now U.S. Pat. No. 4,811,420.

Once the subscriber unit has gained RCC sync, it can set up a call by exchanging messages over the RCC with the base station, and by monitoring and setting hardware signals on the telephone interface. The following walk through briefly describe the events that take place during call setup.

Normal call setup for call origination begins with the subscriber taking the handset off hook to initiate a service request. The SCT sends a CALL REQUEST message to the base station. The SCT receives a CALL CONNECT message. The SCT signals the CCT to attempt sync on the voice channel assigned via the CALL CONNECT message. The CCT attains sync on the voice channel. The subscriber receives a dial tone from the central office. Call setup is complete. The central office provides the remaining call termination support.

Normal call setup for call termination takes place as follows: The SCT receives a PAGE message from the base station. The SCT replies with a CALL ACCEPT. The SCT receives a CALL CONNECT message. The SCT signals the CCT to attempt sync on the voice channel assigned via the CALL CONNECT message. The CCT attains sync on the voice channel. The SCT starts the Ring Generator to apply ring to the local loop. The subscriber takes the hand set off hook. The ringing is stopped. The voice connection is complete.

The SCT implements the call setup and teardown operations as a finite state machine.

If a voice channel seizure is successfully completed, the SCT switches to the voice mode and performs a very limited set of support functions. SCT processor loading is kept to a minimum at this time to give the RELP speech compression, echo cancellation and modem processing algorithms maximum The SCT enters the abort mode as a result of an unsuccessful call origination attempt or an unexpected call teardown sequence. During the abort mode, a reorder is sent to the handset. The SCT monitors the subscriber telephone interface for a disconnect (extended on-hook), at which time the subscriber unit enters the idle Mode. Base station requests received over the radio control channel (RCC) are rejected until the disconnect is detected.

The CCT 92 operates as a link level channel controller in the baseband software. The CCT has three fundamental states: RCC operation, refinement, and voice operation.

At power up, the CCT enters the RCC operation state to search for and then support the RCC channel The RCC operation includes the following functions: AM hole control; monitoring sync and modem task status; radio channel timing adjustment; RX RCC message filtering; TX RCC message formatting; monitoring the PCM buffer I/O; and link information processing.

After a voice connection is established, the CCT enters the refinement state to fine tune the modem's fractional timing. Refinement includes the following function; interpreting and responding to refinement bursts; creating and formatting TX refinement bursts; forwarding messages to the SCT as appropriate; monitoring the modem status; and monitoring the PCM buffer I/O.

Following Refinement, the CCT begins voice operation, which includes the following functions: code word signalling support; dropout recovery; monitoring sync and modem status; and monitoring the PCM buffer I/O.

The CCT 92 has three fundamental states of operation: idle, refinement and voice. The following is a walk through of the state transitions involved in CCT operation.

After a reset the CCT enters the idle state and remains inactive until given channel assignment instructions by the SCT. The SCT provides the CCT with a frequency upon which to search for the radio control channel (RCC). The CCT then instructs the MPT to synchronize the receiver to the given frequency and to search for an AM hole. Failure to detect an AM hole within a predetermined time period causes the CCT to request another frequency upon which to search from the SCT. This continues indefinitely until the AM hole detection is successful.

Following a successful AM hole detection, the CCT begins to check received data for the unique word. A small window around the nominal unique word position is scanned since the AM hole detection process may be off by a few symbol times. Once the unique word is located and the CRC error detection word is verified correct, the exact receive symbol timing can be determined. The TDM framing markers are then adjusted to the correct alignment and normal RCC support begins. If the unique word cannot be located, the AM hole detection is considered false and the CCT requests a new frequency assignment from the SCT.

During RCC operation the CCT filters received RCC messages. The majority of the base station's RCC messages are null patterns and these are discarded after link information is read from the link byte. RCC messages that contain real information are forwarded to the SCT for processing. If RCC synchronization is lost, the CCT again requests a new frequency from tile SCT. The SCT will respond with the correct frequency according to the RCC frequency search algorithm.

When the SCT initiates a voice call, the CCT is assigned a voice channel and time slot. The CCT brings the subscriber unit active according to this assignment and begins the refinement process. During refinement, the base and subscriber unit is transmit a BPSK signal specifically designed to assist the modem in fractional bit time acquisition. The base station CCU relays the bit timing offset back to the subscriber unit as a two's complement adjustment value. The CCT maintains a time average of these fedback offsets. Once the CCT determines that the fractional timing value is within a required tolerance, it adjusts the subscriber unit's transmit timing accordingly. The length of the time average is determined dynamically, depending upon the variance of the fractional time samples. After a timing adjustment, the time average is reset and the procedure is repeated.

Once the base station detects that the subscriber unit is within an acceptable timing tolerance, it terminates the refinement process and voice operation begins. The length of the refinement process is determined dynamically, depending upon the success of the subscriber unit's timing adjustments. Power and integer symbol timing are also monitored and adjusted as necessary during the refinement process. If the subscriber fails to find the base station's refinement bursts after a period of time, or if the refinement process cannot yield acceptable timing, the connection is broken and the CCT returns to RCC operation.

Following successful refinement, the CCT enters voice operation at the assigned modulation level. The voice operation tasks include controlling RELP and MPT operations, establishing voice synchronization and continuously monitoring the voice code words sent from the base station. Local loop control changes, signalled via the code words, are reported to the SCT as they occur. Power and fractional timing incremental changes are also determined from the code words. Transmitted voice code words are formulated by the CCT based upon the local loop control provided by the SCT and the channel link quality reported by the modem. The CCT returns to the RCC when the SCT executes a call teardown sequence.

If voice synchronization is lost, the CCT initiates a fade recovery operation. After ten seconds of failure to reestablish a good voice connection, the CCT informs the SCT of the condition, initiating a call teardown. This returns the CCT to the Idle state.

During a channel test operation, a voice burst is replaced with channel test data. When a burst has just been received, it is analyzed for bit errors. The bit error count is passed to the base station via the reverse channel bursts.

The SPT 93 performs all of the digital signal processing (DSP) tasks within the subscriber unit. The various DSP functions are invoked as required, under the control of the supervisor module 95.

The SPT includes a RELP module, which is executed from a high speed RAM. The RELP module performs RELP Speech compression and expansion with echo cancellation. The RELP module transforms 180 byte blocks of 64 Kbps PCM voice data to and from 42 bytes of compressed voice data using the RELP algorithm.

The SPT also includes a signal processing control (SPC) module, which determines if tone generation or RELP should be invoked. If RELP, SPC determines whether to call the synthesis or analysis routines. The synthesis routine returns a parity error count, which is handled by the SPTCTL routine. If tone generation is required, it determines whether to output silence or reorder.

The SPT is controlled via commands from the SCT and the CCT. These commands invoke and control the operation of the various functions within the SPT as they are required by the subscriber unit. RELP and echo cancellation software, for example, are only executed when the subscriber unit is active on a voice call. Call progress tones are generated anytime the subscriber unit's receiver is off hook and RELP is not active. The tones include silence and reorder. Except for the IDLE mode, the interrupt service routine handling the PCM codec operates continuously as a foreground process, filling the circular PCM buffer.

The control and modem functions are performed in between the analysis and synthesis processing.

The MPT 94 demodulation procedure is divided into two procedures: DEMODA & DEMODB, thus allowing the RELP synthesis to be executed on the RX data in buffer A right after the DEMODA procedure is completed. After DEMODA all internal RAM variables should be stored in external RAM, then reloaded to internal RAM before performing DEMODB. This is because RELP uses the internal RAM.

When the RXCLK interrupt on line 26c is received by the processor chip 12, the MPT causes four received RX data samples to be read and then placed in a circular buffer, for processing by the demodulation procedure. This allows other tasks to be performed while receiving RX samples.

The MPT receives the RXCLK interrupt signal on line 26c from the FIR chip 16 every 62.5 sec during the receive slot. The RXCLK interrupt signal is masked by the processor chip firmware during idle or transmit slots.

The MPT receives the TXCLK interrupt signal on line 26a from the FIR chip 16 only during the transmit slot. The TXCLK interrupt signal tells the processor chip 12 when to send a new TX symbol to the FIR chip.

The MPT reads four samples from the RX sample buffer 35 in the FIR chip 16 during each RXCLK interrupt on line 26c. The MPT resets the input and output address counters to the buffer at the start of the receive slot.

The MPT ends TX symbols to the TX symbol buffer 36 in the FIR chip 16.

The MPT provides the data to the fractional timing circuit in the RX timing module 39 in the FIR chip 16 that is used to align the RXCLK interrupt signal on line 26c with the base station transmission.

The MPT also synchronizes the DDS frequency to the base station transmit frequency.

Figure 5:
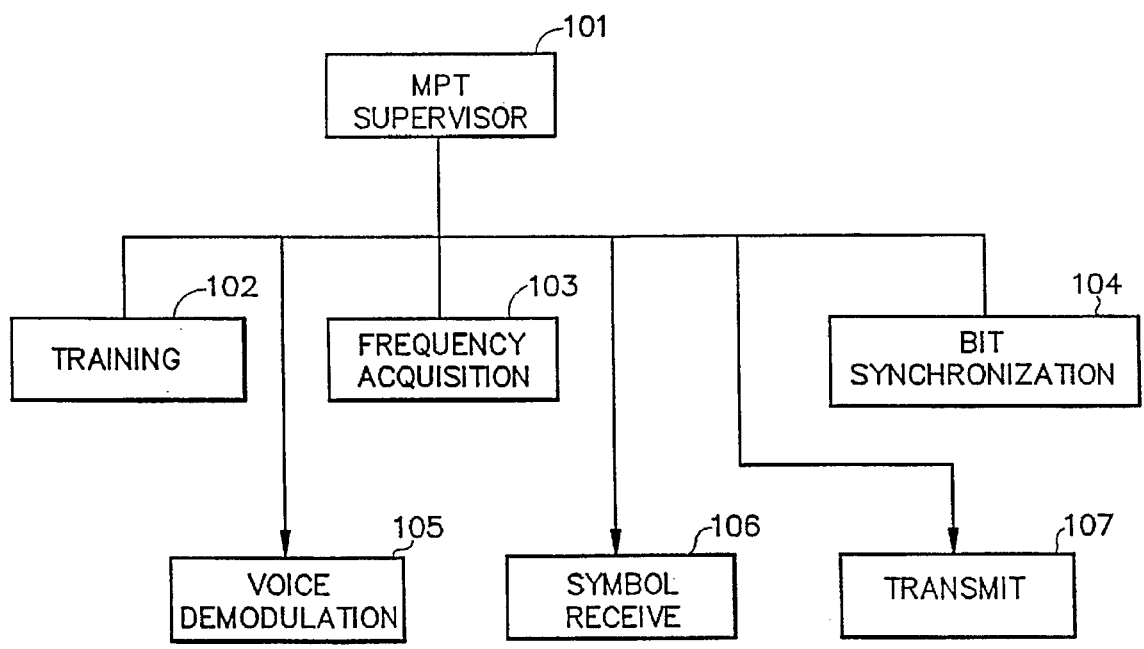
FIG. 5 illustrates the processing routines included in modem processing task shown in FIG. 4.

Referring to FIG. 5 the MPT includes the following modules: a supervisor module 101, a training module 102, a frequency acquisition module 103, a bit synchronization module 104, a voice demodulation module 105, a symbol receive module 106, and a transmit module 107.

The supervisor module 101 is the MPT task supervisor. It reads the MPT control word (CTRL0) from the RAM, and calls other routines according to the control word.

The training module 102 computes a vector of 28 complex FIR filter coefficients. It is activated in the idle mode after power up and about every three hours. A training transmitter implemented by the MPT is activated in a loopback mode to send a certain sequence of symbols. This sequence is looped back to a training receiver implemented by the MPT, in a normal mode, in advanced and delayed timing modes, and in upper and lower adjacent channels.

The training receiver uses the samples of the input waveform to create a positive definite symmetric matrix A of order 28. Also a 28-word vector V is created from the input samples. The coefficients vector C is given by:

$$mC = A^{-1} V \qquad \{Eq.10\}$$

The B coefficient is then calculated according to the algorithm: $B = A^{-1}$ given A.

The training transmitter is activated in the loopback made to transmit five similar pairs of sequences. Each pair consists of the following two sequences:

I sequence: 9 null symbols, "i", 22 null symbols

Q sequence: 9 null symbols, "j", 22 null symbols

The "i" can be any symbol. The "j" is a symbol that differs from "i" by 90 degrees.

The receiver processing tasks are:

Adjust the AGC so that the signal peak in the normal mode is 50 to 70% of the maximum. The AGC is increased by 23 db for the 4th and 5th modes.

Read and store the input samples. The first 32 samples are discarded and the next 64 samples are stored, for each sequence.

Build the matrix A(28,28). The following process is done in the normal mode:

$$A(I,J) = A(I,J) + \Sigma X(4N-I) \cdot X(4N-J) \qquad \{Eq.11\}$$

The addition is for all N that satisfy:

$$0 <= 4N-I < 64 \ \& \ 0 <= 4N-J < 64 \qquad \{Eq.12\}$$

For the advanced and delayed sequences, the same process is performed except that the term resulting from N=8 is not added. In the upper and lower adjacent channel channel sequences, the following process is performed:

$$A(I,J) = A(I,J) + \Sigma X(2N-I) \cdot X(2N-J) \qquad \{Eq.13\}$$

The addition is for all N that satisfy:

$0 \leq 2N-I < 64 \& 0 \leq 2N-J < 64$ {Eq.14}

Create the vector V(1:28) from the samples of the first pair of sequences:

Re{V(I)}=X(32-I) ;where X are samples of the first(I) sequence.

Im{V(1)}=X(32-I) ;where X are samples of the second (Q) sequence.

Find the coefficients vector C by solving the equation:

$$A \times C - V = 0 \qquad \{Eq. 15\}$$

These processing steps are more fully described in U.S. Pat. No. 4,644,561 issued Feb. 17, 1987 to Eric Paneth, David N. Critchlow and Moshe Yehushua.

The frequency acquisition module 103 is run when receiving the control channel, in order to synchronize the subscriber unit RX frequency to the base station transmit frequency. This is done by adjusting the DDS CW output until the energies of the received signal's two sidebands are equal. Afterwards, the DDS TX frequencies are adjusted according to the computed frequency deviation.

If the procedure fails to achieve frequency sync, an appropriate error code is placed in the status word.

The bit synchronization module 104 is run when receiving the RCC and after completing the frequency acquisition. A certain pattern is transmitted in the first 44 symbols in the RCC transmission from the base station, and this is used by this module to compute the RXCLK deviation from the correct sampling time. This deviation is used to adjust the RXCLK timing.

The voice demodulation module 105 is activated to demodulate a voice slot. It is resident in the slow EPROM and its functions are divided between two procedures DEMODA and DEMODB.

The DEMODA functions include initializing parameters for the symbol receive module 106; calling the symbol receive module to process the received symbols for buffer A; and storing the variables in external RAM before exiting.

The DEMODB functions include loading the variables from external RAM to internal RAM; calling the symbol receive module to process the received symbols for buffer B; and determining link quality and other information after receiving all the symbols in the slot.

The symbol receive module 106 is uploaded to the RAM when the CCT goes to the voice mode. It is called by DEMODA or DEMODB to perform the following: (1) read I and Q samples from the circular buffer; (2) FIR filtering of the I&Q samples; (3) determine the transmitted symbols and and put them in a buffer; (4) execute a phase-lock-loop to synchronize the DDS to the incoming signal; execute the bit tracking algorithm; (8) AGC calculation; and (7) accumulate data for link quality calculation.

The transmit module 107 includes the interrupt service routine for the TXCLK interrupt signal received on line 26c from the FIR chip 16, which occurs once per two symbols during a transmit slot. The functions of the transmit module 107 include: (1) unpacking the transmit symbol from the RELP buffer; (2) performing an inverse GRAY coding on it; (3) adding it to the previous transmitted phase (because of the DPSK transmission); and (4) sending it to the TX buffer in the FIR chip 16.

The interface of the MPT to the baseband tasks is accomplished via control and status words and data buffers in the shared memory. Procedures requiring fast execution are uploaded into the cache memory when needed. These include the interrupt service routines, symbol demodulation, RCC acquisition, and BPSK demodulation.

The MPT supervisor will not wait for RXSOS to read and decode the control word, but will do that immediately when it is called.

The TMS320C25 goes to a powerdown mode when executing the IDLE instruction. In order to conserve power the firmware will be in the idle mode most of the time, when there is no phone call in progress. So after a reset the supervisor will acquire RCC sync then go to idle mode until a predetermined interrupt causes a corresponding service routine to be executed. When operated in the powerdown mode, the TMS320C25 enters a dormant state and requires only a fraction of the power normally needed to supply the device. While in powerdown mode, all of the internal contents of the processor are maintained to allow operation to continue unaltered when the powerdown mode is terminated. Upon receipt of an interrupt the processor chip 12 terminates the powerdown mode temporally and resumes normal operation for a minimum time of one main loop cycle. The requirements of the powerdown mode are checked at end of main loop every time to determine whether or not the subscriber unit to return to the powerdown mode.

The slot clock is based on the hardware generated slot timing. When a slot marker triggers an interrupt, the routine increments the clock by one tick. Each clock tick represents 11.25 ms in time.

The receive and transmit functions of the UART are not interrupt driven, but are controlled by the background software (this controls processor loading and prevents runaway interrupt conditions). The processing code supports the XON/XOFF protocol by intercepting these characters directly and immediately enabling or disabling UART transmission as appropriate. The rate of the receive and transmit operation is designed to be selective by an external DIP switch device. The typical data reception rate is at 9600 baud. A circular buffer is used to control the UART's transmission. The background software periodically checks the queue and initiates transmission if it is not empty. It does this by sending bytes to the UART one byte at a time until the queue is empty.

The switch hook is sampled with the TMS320C25 internal timer interrupt routine. To simulate DC signalling, a 1.5 ms sample period is used. This interrupt is aligned to frame timing at the beginning of each frame; therefore its frequency is phase locked to the base station to prevent underrun or overflow of the switch hook buffer. For each interrupt, a bit representing the switch hook detect signal (from the SLIC) is entered in the 60-bit Switch Hook Sample buffer (SSB). The SSB is examined by the SCT once every 45 ms during normal operation. This interrupt is enabled by the software at all times.

What is claimed is:

1. A digital frequency synthesizer for use in a subscriber unit of a wireless digital communication system comprising:

a processor, for providing an output phase signal corresponding to a selected output digital frequency;

means for buffering said phase signal;

lookup table means comprising a memory device having two sets of predefined stored values pertaining to the amplitude of a signal for a single quadrant, wherein said predefined stored values comprise coarse angle approximations and fine angle approximations;

signal generator means for receiving said phase signal and generating sine and cosine waveforms utilizing amplitude values obtained from said lookup table means, wherein said phase signal includes phase data and specifies the quadrant and the algebraic sign of the phase data;

said signal generator means accessing said lookup table means differently depending upon the quadrant and sign of the phase data such that the lookup table means provides an amplitude value from said sets of predefined stored values based upon the phase data;

means for combining the sine and cosine waveforms to produce said selected output digital frequency; and means for modulating said digital frequency.

2. The digital synthesizer of claim 1 wherein the lookup table means includes a first table having values pertaining to large angle approximations for coarse resolution frequency adjustment of the digital frequency and a second table for stored values pertaining to small angle approximation for fine resolution frequency adjustment.

3. The digital synthesizer of claim 2 wherein the size of said first and second tables is reduced using trigonometric decomposition.

* * * * *

UNITED STATES PATENT AND TRADEMARK OFFICE
CERTIFICATE OF CORRECTION

PATENT NO. : 5,644,602

DATED : July 1, 1997

INVENTOR(S) : Critchlow et al.

It is certified that error appears in the above-identified patent and that said Letters Patent is hereby corrected as shown below:

At column 4, line 14, delete ":." and insert therefor --,--.

At column 5, line 56, delete "frown" and insert therefor --from--.

At column 5, line 56, delete "Mhz" and insert therefor --MHz--.

At column 5, line 57, delete "276" and insert therefor --276--.

At column 6, line 38, delete "25.,and" and insert therefor --25 and--.

At column 7, line 50, delete "docked" and insert therefor --clocked--.

At column 7, line 59, delete "KHZ" and insert therefor --KHz--.

At column 7, line 61, delete "KHZ" and insert therefor --KHz--.

At column 8, line 9, delete "sec." and insert therefor --$\mu$sec.--.

At column 8, line 23, delete "38" and insert therefor --39--.

At column 9, line 12, after the word "ten", insert --Q--.

At column 9, line 43, delete "1s" and insert therefor --1's--.

At column 10, line 20, delete "Mhz" and insert therefor --MHz--.

At column 10, line 23, delete "Thus" and insert therefor --thus--.

At column 11, line 1, delete "Mhz" and insert therefor --MHz--.

At column 11, line 6, delete "DOS" and insert therefor --DDS--.

At column 11, line 8, delete "DOS" and insert therefor --DDS--.

UNITED STATES PATENT AND TRADEMARK OFFICE
CERTIFICATE OF CORRECTION

PATENT NO. : 5,644,602

DATED : July 1, 1997

INVENTOR(S) : Critchlow et al.

It is certified that error appears in the above-identified patent and that said Letters Patent is hereby corrected as shown below:

At column 11, line 22, delete "crocks" and insert therefor --clocks--.

At column 11, line 28, after the word "shift", insert --I--.

At column 11, line 36, delete "Mhz" and insert therefor --MHz--.

At column 11, line 39, delete "Mhz" and insert therefor --MHz--.

At column 11, line 50, delete "Mhz" and insert therefor --MHz--.

At column 12, line 12, before the word "FIR", delete "the." and insert therefor --the--.

At column 12, line 62, delete "Mhz" and insert therefor --MHz--.

At column 14, Eqn. 4, delete "$(\phi_1\phi2)$" and insert therefor --$(\phi_1\phi_2)$--.

At column 15, line 1, after the word "it", insert --is--.

At column 15, line 26, delete "0.0.25," and insert therefor --0, 0.25,--.

At column 17, line 42, after the word "mum", insert --processor availablity.--.

At column 17, line 63, delete "function;" and insert therefor --functions;--.

At column 18, line 35, delete "tile" and insert therefor --the--.

At column 18, line 42, after the word "scriber", delete "unit is transmit" and insert therefor --units transmit--.

At column 19, line 63, delete "sec" and insert therefor --$\mu$sec--.

At column 20, Eqn. 10, delete "mC" and insert therefor --C--.

At column 20, line 39, delete "made" and insert therefor --mode--.

UNITED STATES PATENT AND TRADEMARK OFFICE
CERTIFICATE OF CORRECTION

PATENT NO. : 5,644,602

DATED : July 1, 1997

INVENTOR(S) : Critchlow et al.

It is certified that error appears in the above-identified patent and that said Letters Patent is hereby corrected as shown below:

At column 21, line 48, after the word "symbols", delete "and".

At column 21, line 50, after the word "signal;", insert -- (5) --.

At column 21, line 51, delete "(8)" and insert therefor -- (6) --.

At column 24, line 2, after the word "having", insert --stored--.

At column 24, line 5, delete "approximation" and insert therefor --approximations--.

Signed and Sealed this

Twenty-first Day of October 1997

Attest:

BRUCE LEHMAN

Attesting Officer

Commissioner of Patents and Trademarks